(12) United States Patent
Kuo

(10) Patent No.: US 8,202,766 B2
(45) Date of Patent: Jun. 19, 2012

(54) METHOD FOR FABRICATING THROUGH-SILICON VIA STRUCTURE

(75) Inventor: Chien-Li Kuo, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 110 days.

(21) Appl. No.: 12/487,665

(22) Filed: Jun. 19, 2009

(65) Prior Publication Data

US 2010/0323478 A1    Dec. 23, 2010

(51) Int. Cl.
*H01L 21/768* (2006.01)
*H01L 21/56* (2006.01)

(52) U.S. Cl. ........ 438/124; 438/653; 438/637; 438/667; 438/682; 257/E21.502; 257/E21.575; 257/E21.577; 257/E21.585

(58) Field of Classification Search .................... 438/38, 438/211, 216, 221, 225, 240, 257, 261, 263, 438/264, 287, 294–307, 626, 629–631, 637–640, 438/645, 646, 668, 672, 675, 697–699, 760, 438/765–794, 967, 981; 257/310–311, 374, 257/389, 410, 411, 506–508, 510, 520, 524, 257/621, 632–651, 671, 701–703, 752, 760, 257/774, E21.23, E21.58, E21.583, E21.304, 257/E21.5, 79, E21.597
See application file for complete search history.

(56) References Cited

U.S. PATENT DOCUMENTS

| | | | |
|---|---|---|---|
| 7,799,678 B2 * | 9/2010 | Kropewnicki et al. | 438/667 |
| 7,846,837 B2 | 12/2010 | Kuo | |
| 2006/0141766 A1 * | 6/2006 | Kim | 438/624 |
| 2007/0190692 A1 | 8/2007 | Erturk | |
| 2008/0206981 A1 * | 8/2008 | Tamura | 438/624 |
| 2009/0191708 A1 * | 7/2009 | Kropewnicki et al. | 438/667 |
| 2010/0019348 A1 * | 1/2010 | Nagai | 257/532 |
| 2010/0237502 A1 * | 9/2010 | Yu et al. | 257/751 |
| 2010/0244247 A1 * | 9/2010 | Chang et al. | 257/741 |
| 2011/0244676 A1 * | 10/2011 | Chen et al. | 438/643 |

OTHER PUBLICATIONS

Jong Wan Jung et al., W Polymetal Gate Technology for Giga Bit DRAM,Journal of Semiconductor Technology and Science , Mar. 2001, p. 31-39, vol. 1, No. 1.

* cited by examiner

*Primary Examiner* — Hsien Ming Lee
*Assistant Examiner* — Walter H Swanson
(74) *Attorney, Agent, or Firm* — Winston Hsu; Scott Margo

(57) ABSTRACT

A method for fabricating through-silicon via structure includes the steps of: providing a semiconductor substrate; forming at least one semiconductor device on surface of the semiconductor substrate; forming a dielectric layer on the semiconductor device, in which the dielectric layer includes at least one via hole; forming a first conductive layer on the dielectric layer and filling the via hole; performing an etching process to form a through-silicon via in the first conductive layer, the dielectric layer, and the semiconductor substrate; depositing a second conductive layer in the through-silicon via and partially on the first conductive layer; and planarizing a portion of the second conductive layer until reaching the surface of the first conductive layer.

12 Claims, 3 Drawing Sheets

METHOD FOR FABRICATING THROUGH-SILICON VIA STRUCTURE

BACKGROUND OF THE INVENTION

1. Field of the Invention

The invention relates to a method for fabricating a through-silicon via structure, and more particularly, to a method of maintaining the depth of interlayer dielectric layer while fabricating a through-silicon via structure.

2. Description of the Prior Art

The through-silicon via technique is a novel semiconductor technique. The through-silicon via technique mainly servers to solve the problem of electrical interconnection between chips and belongs to a new 3D packing field. The through-silicon via technique produces products that meet the market trends of "light, thin, short and small" through the 3D stacking technique and also provides wafer-level packages utilized in micro electronic mechanic system (MEMS), and photo-electronics and electronic devices.

The through-silicon via technique drills holes in the wafer by etching or laser then fills the holes with conductive materials, such as copper, polysilicon or tungsten to form vias, i.e. conductive channels connecting inner regions and outer regions. The wafer or the dice is then thinned to be stacked or bonded together to form a 3D stack IC. By using this approach, the wire bonding procedure could be omitted. Using etching or laser to form conductive vias not only omits the wire bonding but also shrinks the occupied area on the circuit board and the volume for packing. The inner connection distance of the package created by using the through-silicon via technique, i.e. the thickness of the thinned wafer or the dice, is much shorter compared with the conventional stack package of wire bonding type. The performance of the 3D stack IC would therefore be much better in many ways, including faster transmission, and lower noise. The advantage of the shorter inner connection distance of the through-silicon via technique becomes much more pronounced in CPU, flash memory and memory card. As the 3D stack IC could be fabricated to equate the size of the dice, the utilization of through-silicon via technique becomes much more valuable in the portable electronic device industry.

A process for fabricating a through-silicon via structure typically involves following steps. First, at least a metal-oxide semiconductor (MOS) transistor, such as a CMOS transistor is formed on surface of a semiconductor substrate, and contact plugs connecting the MOS transistor are formed thereafter. A through-silicon via electrode having isolating dielectric layer and conductive copper metal is formed by etching through the interlayer dielectric layer and majority of the semiconductor substrate. A plurality of chemical mechanical polishing processes are conducted to form the aforementioned contact plugs and through-silicon via electrode, in which each CMP process is utilized to polish different material layers.

It should be noted that in order to stop a polishing process, such as the aforementioned CMP process, on a particular material layer, a difference in the removal rate under a specific slurry must be provided. As the interlayer dielectric layer and the dielectric layer for isolating through-silicon via are both composed of dielectric material thereby having same removal rate under the same slurry, it would be difficult for a chemical mechanical polishing process to stop on either one of these two layers. Eventually, the depth of the interlayer dielectric layer becomes difficult to control as majority of the interlayer dielectric layer is easily lost during the polishing process.

SUMMARY OF THE INVENTION

It is an objective of the present invention to provide a method for fabricating a through-silicon via structure while resolving the issue of losing too much interlayer dielectric layer during polishing process.

According to a preferred embodiment of the present invention, a method for fabricating through-silicon via structure is disclosed. The method includes the steps of: providing a semiconductor substrate; forming at least one semiconductor device on surface of the semiconductor substrate; forming a dielectric layer on the semiconductor device, wherein the dielectric layer comprises at least one via hole; forming a first conductive layer on the dielectric layer and filling the via hole; performing an etching process to form a through-silicon via in the first conductive layer, the dielectric layer, and the semiconductor substrate; depositing a second conductive layer in the through-silicon via and partially on the first conductive layer; and performing a first planarizing process to remove a portion of the second conductive layer until reaching the surface of the first conductive layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
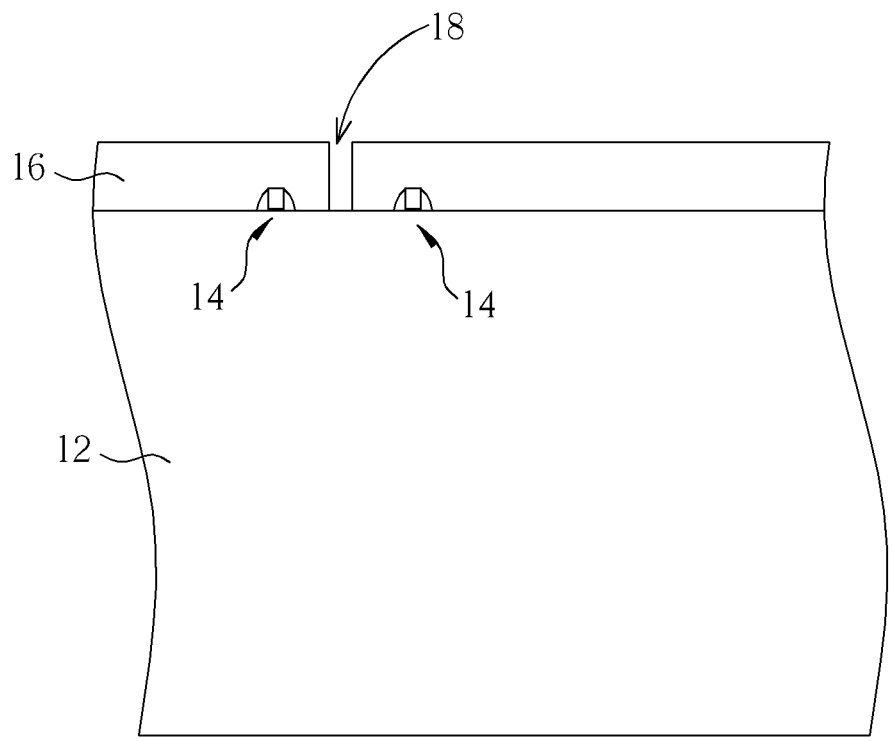
FIGS. 1-6 illustrate a method for fabricating a through-silicon via structure according to a preferred embodiment of the present invention.

Referring to FIGS. 1-6, FIGS. 1-6 illustrate a method for fabricating a through-silicon via structure according to a preferred embodiment of the present invention. As shown in FIG. 1, a semiconductor substrate 12, such as a substrate composed of monocrystalline silicon, gallium arsenide (GaAs) or other known semiconductor material is provided. A standard metal-oxide semiconductor (MOS) transistor fabrication is performed to form at least one MOS transistor 14 or other semiconductor device on the semiconductor substrate 12. The MOS transistor 14 could be a PMOS transistor, a NMOS transistor, or a CMOS transistor, and the MOS transistor 14 could also include typical transistor structures including gate, spacer, lightly doped drains, source/drain regions and/or salicides.

An interlayer dielectric layer 16 with a depth of several thousand angstroms, preferably at 3000 angstroms is deposited on the MOS transistor 14. The interlayer dielectric layer 16 is preferably a composite layer consisted of tetraethylorthosilicate (TEOS) and phosphosilicate glass (PSG), but not limited thereto. The interlayer dielectric layer 16 could also be composed of BPSG or low-k dielectric material, and a stress material layer, such as a tensile or compressive stress layer composed of silicon nitride, an etch stop layer composed of silicon nitride, a thin oxide cap layer, or combination thereof could be inserted between the interlayer dielectric layer 16 and the MOS transistor 14.

Figure 2:
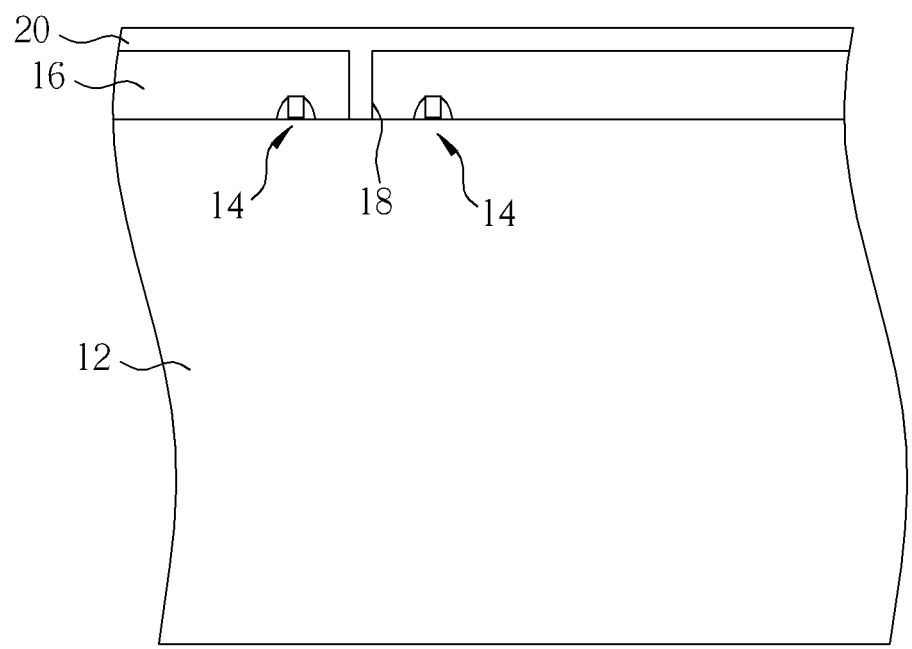

A pattern transfer process is conducted thereafter by using a patterned photoresist (not shown) as mask to etch at least one via hole 18 in the interlayer dielectric layer 16 and depositing a conductive material preferably composed of tungsten on surface of the interlayer dielectric layer 16 and within the via hole 18. The conductive material filled within the via hole 18 preferably connects the MOS transistor 14 while a tungsten conductive layer 20 is formed on the interlayer dielectric layer 16, as shown in FIG. 2. An adhesive layer consisting of Ta, TaN, Ti, TiN, or combination thereof could be formed selectively before the conductive layer 20 is deposited, which is also within the scope of the present invention. The conductive layer 20 could also be composed of conductive material other than tungsten, such as aluminum, copper, or alloy thereof.

Figure 3:
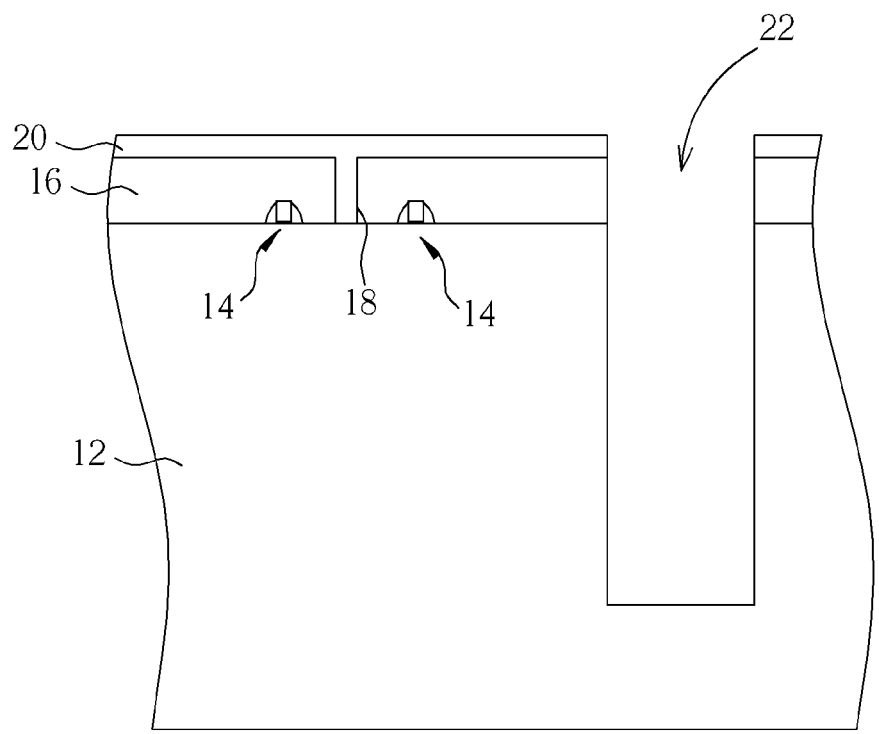

As shown in FIG. 3, another pattern transfer process is formed by using another patterned photoresist (not shown) as mask to perform one or more etching process to form a through-silicon via 22 in the conductive layer 20, the interlayer dielectric layer 16, and the semiconductor substrate 12.

Figure 4:
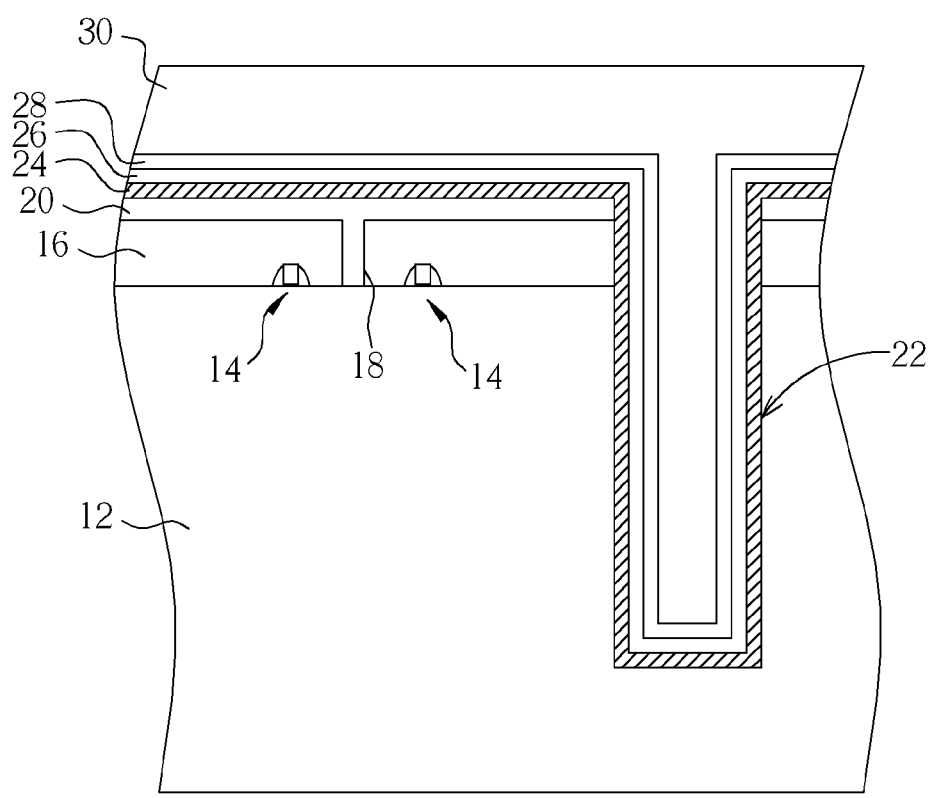

Next, as shown in FIG. 4, an insulating layer 24 is formed on sidewall and bottom of the through-silicon via 22 while covering the surface of the conductive layer 20. The insulating layer 24 preferably served as an isolation between the through-silicon via structure and the surrounding semiconductor substrate 12, such that the two elements would not be connected directly. In this embodiment, the insulating layer 24 could be composed of oxides or nitrides, and could also be composed of a single or composite layer.

A chemical vapor deposition (CVD) is conducted to form a barrier layer 26 and a seed layer 28 on surface of the insulating layer 24, and a metal layer 30 composed of copper is electroplated on surface of the seed layer 28 until filling the entire through-silicon via 22. The barrier layer 26 is preferably selected from a group consisting of Ta, TaN, Ti, and TiN, which could be used to prevent copper ions of the metal layer 30 from migrating to the surrounding insulating layer 24. The seed layer 28 is preferably used to adhere copper ions of the metal layer 30 onto the insulating layer 24 for facilitating the copper electroplating process thereafter. It should be noted that the metal layer 30 could also be composed of conductive materials other than copper, and the seed layer 28 is formed selectively and the material of the seed layer 28 could be adjusted according to the material of the metal layer 30.

Figure 5:
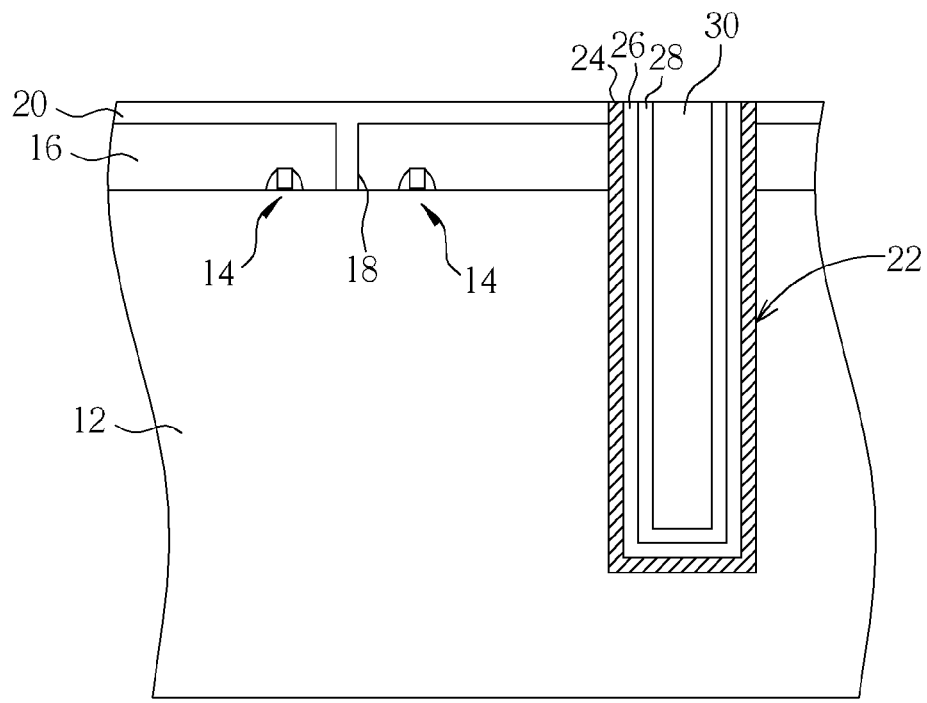
Figure 6:
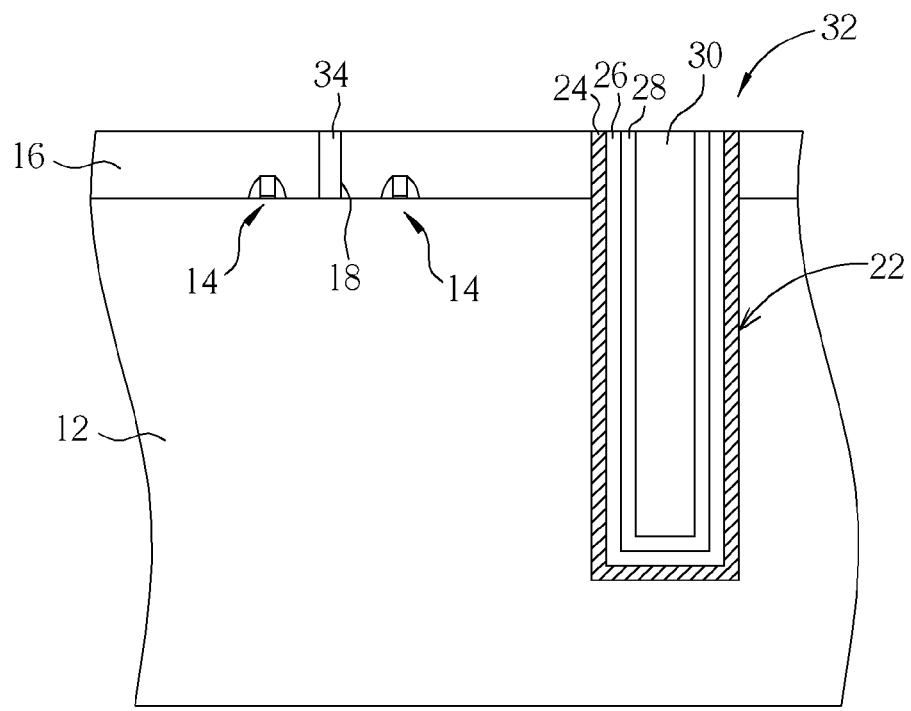

As shown in FIG. 5, a planarizing process, such as a chemical mechanical polishing is conducted by using the conductive layer 20 as a stop layer to remove a portion of the metal layer 30, the seed layer 28, the barrier layer 26, and the insulating layer 24 for exposing the conductive layer 20 such that the metal layer 30 filled within the through-silicon via 22 is even with the conductive layer 20. Next, as shown in FIG. 6, another planarizing process, such as another CMP process is conducted to fully remove the conductive layer 20 and expose the interlayer dielectric layer 16 underneath. This forms a contact plug 34 and a through-silicon via structure 32 within the interlayer dielectric layer 16. According to an embodiment of the present invention, an additional stop layer having different removal rate from the conductive layer 20 under the same slurry could also be formed selectively on top of the conductively layer 20, which is within the scope of the present invention.

It should be noted that the present invention preferably keeps the tungsten layer 20 on top of the interlayer dielectric layer 16 before the through-silicon via 22 is formed, stops the polishing process on surface of the tungsten layer 20 as the copper layer 30 is removed, and uses another in-situ or non in-situ polishing process to remove the remaining tungsten layer 20. As the conductive layer 20 composed of tungsten preferably has a different removal rate from the interlayer dielectric layer 16 underneath under the same slurry, the end point of the CMP process could be controlled without affecting the layer underneath. In other words, the interlayer dielectric layer 16 would not be lost during the polishing process and the depth of the layer 16 is well maintained.

After the conductive layer 20 is removed, a back-end-of-the-line (BEOL) process for the semiconductor chip fabrication is performed. For instance, a plurality of dielectric layers (not shown) is formed on top of the interlayer dielectric layer 16 and the through-silicon via structure 32 and associating metal interconnective fabrication and contact plug fabrication are also carried out to form metal interconnects and contact pads connecting the plug 34.

Those skilled in the art will readily observe that numerous modifications and alterations of the device and method may be made while retaining the teachings of the invention.

What is claimed is:

1. A method for fabricating through-silicon via structure, comprising:
   providing a semiconductor substrate;
   forming at least one semiconductor device on the semiconductor substrate;
   forming a dielectric layer on the at least one semiconductor device, wherein the dielectric layer comprises at least one via hole;
   forming a first conductive layer in one structure, filling the at least one via hole and covering the semiconductor substrate in one process step;
   performing an etching process to form a through-silicon via in the first conductive layer, the dielectric layer, and the semiconductor substrate, wherein no planarizing process on the first conductive layer is performed before the through-silicon via is formed;
   depositing a second conductive layer in the through-silicon via and partially on the first conductive layer; and
   performing a first planarizing process to remove a portion of the second conductive layer so as to expose the first conductive layer covering the semiconductor substrate.

2. The method of claim 1, further comprising forming an insulating layer on the first conductive layer and sidewall and bottom of the through-silicon via before depositing the second conductive layer.

3. The method of claim 2, wherein the first planarizing process comprises removing a portion of the second conductive layer and a portion of the insulating layer until reaching the first conductive layer.

4. The method of claim 2, further comprising forming a barrier layer on a surface of the insulating layer before depositing the second conductive layer.

5. The method of claim 4, wherein the barrier layer is selected from a group consisting of Ta, TaN, Ti, and TiN.

6. The method of claim 4, further comprising forming a seed layer on a surface of the barrier layer before depositing the second conductive layer.

7. The method of claim 1, wherein the first planarizing process comprises a chemical mechanical polishing process.

8. The method of claim 1, further comprising performing a second planarizing process after the first planarizing process to remove the first conductive layer for forming a contact plug in the at least one via hole connecting the semiconductor device.

9. The method of claim 8, wherein the second planarizing process comprises a chemical mechanical polishing process.

10. The method of claim 8, wherein the first conductive layer and the contact plug comprise tungsten.

11. The method of claim 1, wherein the second conductive layer comprises copper.

12. The method of claim 1, wherein the semiconductor device comprises complementary metal-oxide semiconductor (CMOS) transistor.

* * * * *